(12) United States Patent
Park

(10) Patent No.: US 11,500,720 B2
(45) Date of Patent: *Nov. 15, 2022

(54) APPARATUS AND METHOD FOR CONTROLLING INPUT/OUTPUT THROUGHPUT OF A MEMORY SYSTEM

(71) Applicant: SK hynix Inc., Gyeonggi-do (KR)

(72) Inventor: Jeen Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 120 days.

This patent is subject to a terminal disclaimer.

(21) Appl. No.: 17/027,051

(22) Filed: Sep. 21, 2020

(65) Prior Publication Data

US 2021/0311825 A1 Oct. 7, 2021

(30) Foreign Application Priority Data

Apr. 1, 2020 (KR) ........................ 10-2020-0039616

(51) Int. Cl.
| | |
|---|---|
| *G06F 11/10* | (2006.01) |
| *G06F 13/28* | (2006.01) |
| *G06F 11/30* | (2006.01) |
| *G06F 11/16* | (2006.01) |
| *G06F 11/07* | (2006.01) |

(Continued)

(52) U.S. Cl.
CPC ........ *G06F 11/1068* (2013.01); *G06F 11/076* (2013.01); *G06F 11/3037* (2013.01); *G06F 12/0871* (2013.01); *G06F 12/1045* (2013.01); *G11C 7/1057* (2013.01); *G11C 7/1084* (2013.01)

(58) Field of Classification Search
CPC ......... G06F 2212/1016; G06F 12/0871; G06F 11/076; G06F 12/123; G06F 2212/7201; G06F 11/1666; G06F 12/1045; G06F 12/0246; G06F 2212/7208; G06F 11/3037; G06F 11/1068; G06F 11/2094; G06F 12/0607; G06F 2201/885; G06F 11/1048; G11C 7/1084; G11C 29/42; G11C 29/4401; G11C 7/1057; G11C 7/1042; G11C 2029/0411

See application file for complete search history.

(56) References Cited

U.S. PATENT DOCUMENTS 9,229,854 B1 1/2016 Kuzmin et al.
9,432,298 B1 8/2016 Smith
(Continued)

*Primary Examiner* — Guy J Lamarre
(74) *Attorney, Agent, or Firm* — IP & T Group LLP

(57) ABSTRACT

A memory system includes a memory device including a plurality of memory units capable of inputting or outputting data individually, and a controller coupled with the plurality of memory units via a plurality of data paths. The controller is configured to perform a correlation operation on two or more read requests among a plurality of read requests input from an external device, so that the plurality of memory units output plural pieces of data corresponding to the plurality of read requests via the plurality of data paths based on an interleaving manner. The controller is configured to determine whether to load map data associated with the plurality of read requests before a count of the plurality of read requests reaches a threshold, to divide the plurality of read request into two groups based on whether to load the map data, and to perform the correlation operation per group.

20 Claims, 10 Drawing Sheets

(51) Int. Cl.
*G11C 7/10* (2006.01)
*G06F 12/1045* (2016.01)
*G06F 12/0871* (2016.01)

(56) References Cited

U.S. PATENT DOCUMENTS

| | | | | |
|---|---|---|---|---|
| 10,997,094 B2* | 5/2021 | Park | ................... | G06F 13/1647 |
| 2009/0157946 A1 | 6/2009 | Arya | | |
| 2010/0208540 A1* | 8/2010 | Shiu | ...................... | G11C 5/025 |
| | | | | 365/230.03 |
| 2017/0123674 A1* | 5/2017 | Mori | ...................... | G06F 3/0649 |

\* cited by examiner

APPARATUS AND METHOD FOR CONTROLLING INPUT/OUTPUT THROUGHPUT OF A MEMORY SYSTEM

CROSS-REFERENCE TO RELATED APPLICATION

This patent application claims priority under 35 U.S.C. § 119(a) to Korean Patent Application No. 10-2020-0039616, filed on Apr. 1, 2020, the entire disclosure of which is incorporated herein by reference.

FIELD

One or more embodiments described here relate to a method and apparatus for controlling data throughput of a memory system.

BACKGROUND

Many modern computing devices have been designed to be accessible anytime and anywhere. Examples of these computing devices include mobile phones, digital cameras, and notebook computers. These devices typically use or include a memory system having at least one memory device for storing data. The at least one memory device can be used as a main storage device or an auxiliary storage device.

Unlike hard disks, nonvolatile semiconductor memory devices exhibit excellent stability and durability because they have no mechanical driving parts (e.g., mechanical arms). They also have high data access speeds and low power consumption. Examples nonvolatile semiconductor memory devices include universal serial bus (USB) memory devices, memory cards having various interfaces, and solid state drives (SSDs).

BRIEF DESCRIPTION OF THE DRAWINGS

The description herein makes reference to the accompanying drawings wherein like reference numerals refer to like parts throughout the several views.

Figure 1:
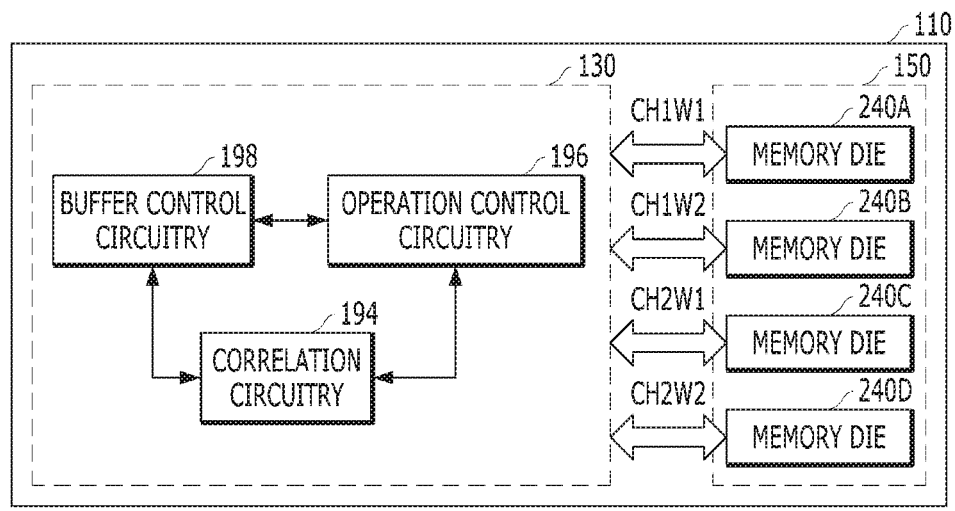
FIG. 1 illustrates a memory system according to an embodiment.

In this disclosure, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

DETAILED DESCRIPTION

Various embodiments of the disclosure are described below with reference to the accompanying drawings. Elements and features of the disclosure, however, may be configured or arranged differently to form other embodiments, which may be variations of any of the disclosed embodiments.

In this disclosure, the terms "comprise," "comprising," "include," and "including" are open-ended. As used in the appended claims, these terms specify the presence of the stated elements and do not preclude the presence or addition of one or more other elements (e.g., an interface, circuitry, etc.).

In this disclosure, various units, circuits, or other components may be described or claimed as "configured to" perform a task or tasks. In such context, "configured to" is used to connote structure by indicating that the blocks/units/ circuits/components include structure (e.g., circuitry) that performs one or more tasks during operation. As such, the block/unit/circuit/component can be said to be configured to perform a task even when the blocks/unit/circuit/component is not currently operational (e.g., is not on). The block/unit/ circuit/component used with the "configured to" language may include hardware, for example, a circuit, memory storing program instructions executable to implement the operation, etc. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in the disclosure, the term 'circuitry' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/ software (including digital signal processor(s)), software, and memory(ies) that work together to cause an apparatus, such as a mobile phone or server, to perform various functions) and (c) circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" also covers an implementation of merely a processor (or multiple processors) or portion of a processor and its (or their) accompanying software and/or firmware. The term "circuitry" also covers, for example, and if applicable to a particular claim element, an integrated circuit for a storage device.

As used herein, these terms "first," "second," "third," and so on are used as labels for nouns that they precede, and do not imply any type of ordering (e.g., spatial, temporal, logical, etc.). The terms "first" and "second" do not necessarily imply that a first value must be written before a second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other cases, A may be determined based solely on B.

An embodiment of the disclosure may provide a memory system, a data processing system, and an operation process or a method, which may quickly and reliably process data into a memory device by reducing operational complexity and performance degradation of the memory system, thereby enhancing usage efficiency of the memory device.

In accordance with one or more embodiments, a method and an apparatus a provided for inputting and/or outputting plural items of data to/from a plurality of memory units in a memory system. This may be accomplished using an interleaving scheme or pattern, which in at least one embodiment can improve data input/output performance (e.g., I/O throughput) of the memory system. Herein, an item of data or a data item may be a sequence of bits. For example, the data item may include the contents of a file, a portion of the file, a page in memory, an object in an object-oriented program, a digital message, a digital scanned image, a part of a video or audio signal, or any other entity which can be represented by a sequence of bits. According to an embodiment, the data item may include a discrete object.

These or other embodiments may provide a memory system which is not limited by the physical location of data to be stored for an interleaving operation, during performance of a process of storing the data in a plurality of memory units. As a result, the plurality of memory units in the memory system may be efficiently and effectively used, which, in turn, can improve operation stability and lifespan of the memory system.

These or other embodiments may provide an apparatus and a method for dynamically determining whether to proceed or stop a correlation operation for plural requests. This decision may be performed based on the configuration of the memory system and/or characteristics of the correlation operation, which may influence operations such as, for example, reading or writing data performed in the memory system. As a result, processing overhead relating to the memory system may be reduced.

These or other embodiments may provide a memory system which reduces map replacement in a volatile memory. The map replacement may be performed and controlled by a controller for a correlation operation, in order to support an interleaving operation relative to a plurality of memory units in the memory system. As a result, operational efficiency of the memory system ay be increased.

In an embodiment, a memory system can include a memory device including a plurality of memory units capable of inputting or outputting data individually, and a controller coupled with the plurality of memory units via a plurality of data paths. The controller can be configured to perform a correlation operation on two or more read requests among a plurality of read requests input from an external device. The correlation operation can be performed so that the plurality of memory units output plural items of data corresponding to the plurality of read requests via the plurality of data paths based on an interleaving manner. The controller can be further configured to determine whether to load map data associated with the plurality of read requests before a count of the plurality of read requests reaches a threshold, to divide the plurality of read request into two groups based on whether to load the map data, and to perform the correlation operation per group.

The controller can be configured to perform the correlation operation when a number of items of data stored in an output buffer before being outputted to the external device, is greater than a threshold.

The output buffer can include a queue capable of outputting stored data according to an input sequence of the stored data. The controller can be configured to determine the threshold based on a first data input/output speed between the external device and the memory system and a second data input/output speed between the controller and the plurality of memory units.

The controller can be configured to: establish a region allocated for storing the map data in a cache memory or a volatile memory; store the map data delivered from the plurality of memory units in the region; and when map data associated with one or more logical addresses input with the plurality of read requests is not loaded in the region, request unloaded map data at the plurality of memory units.

The controller can be configured to release an item of map data, which is least recently used, in the region when requested map data is not storable in the region.

The controller can be configured to release an item of map data, which is least frequently used, in the region when requested map data is not storable in the region.

The memory system can further include a memory configured to store the map data used for address translation; an input buffer configured to store the plurality of read requests; and an output buffer configured to store the plural items of data outputted to the external device.

The controller can include buffer control circuitry configured to monitor states of both the input buffer and the output buffer to determine whether to perform the correlation operation; grouping circuitry configured to divide the plurality of read requests into the two groups, including a map miss group and a map hit group, based on whether the map data corresponding to logical addresses input with the plurality of read requests is loaded in the memory; correlation circuitry configured to perform a first correlation operation on first read requests in the map hit group, request map data corresponding to one or more second read requests in the map miss group at the memory device to store requested map data in the memory, and perform a second correlation operation on both the one or more second read requests and one or more of the first read requests which is not correlated through the first correlation operation; and operation control circuitry configured to transmit read requests correlated through the first and second correlation operations to the plurality of memory units via the plurality of data paths, based on a correlation sequence of the read requests.

The operation control circuitry can be configured to perform address translation for uncorrelated read requests sequentially and transmit the uncorrelated read requests to the plurality of memory units, after performing address translation for correlated read requests.

The correlation circuitry can be configured to monitor an operation state of the operation control circuitry and transmit at least one of the first read requests to the operation control circuitry, without performing the first correlation operation, when the operation control circuitry is in an idle state.

For example, a count of read requests correlated with each other can be the same as a count of the plurality of data paths.

In another embodiment, a method for operating a memory system can include receiving a plurality of read requests from an external device; determining whether to load map data associated with the plurality of read requests when a count of the plurality of read requests reaches a threshold; dividing the plurality of read requests into two groups based on whether to load the map data; performing the correlation operation per group; transmitting correlated read requests to a plurality of memory units via a plurality of channels, according to a correlation sequence; receiving data corresponding to the correlated read request from the plurality of memory units via the plurality of channels based on an interleaving manner; and outputting the data to the external device.

The method can further include performing the address translation for an uncorrelated read request to transfer the uncorrelated read request to a plurality of memory units via a plurality of channels; and receiving other data corresponding to the uncorrelated read request from the plurality of memory dies to output the other data to the external device.

The method can further include determining when the number of items of data, stored in an output buffer before being output to the external device, is greater than a threshold.

The threshold can be determined based on a first data input/output speed between the external device and the memory system and a second data input/output speed between the controller and the plurality of memory units.

The determining whether to load the map data can include, when map data associated with one or more logical addresses input with the plurality of read requests is not loaded in a cache memory or a volatile memory, requesting unloaded map data at the plurality of memory units.

The controller can be configured to release an item of map data, which is least recently used, in the region when requested map data is not storable in the region.

The controller can be configured to release an item of map data, which is least frequently used, in the region when requested map data is not storable in the region.

The dividing the plurality of read requests can include dividing the plurality of read requests into the two groups, including a map miss group and a map hit group, based on whether the map data corresponding to logical addresses input with the plurality of read requests is loaded in the memory.

The performing of the correlation operation can include performing a first correlation operation on first read requests in the map hit group; requesting map data corresponding to one or more second read requests in the map miss group at the memory device to store requested map data in the memory; and performing a second correlation operation on both the one or more second read requests and some of the first read requests which is not correlated through the first correlation operation.

In another embodiment, an apparatus can include one or more couplings to a plurality of data paths; and a controller configured to communicate with a plurality of memories via the one or more couplings to the plurality of data paths. The controller may be configured to perform a correlation operation on one or more read requests among a plurality of read requests input from an external device, the correlation operation performed so that the plurality of memory units output plural items of data corresponding to the plurality of read requests via the plurality of data paths based on an interleaving pattern. The controller may be further configured to determine whether to load map data associated with the plurality of read requests before a count of the plurality of read requests reaches a threshold, divide the plurality of read requests into two groups based on whether to load the map data, and perform the correlation operation per group.

Embodiments of the disclosure are described in detail below with reference to the accompanying drawings, wherein like numbers reference like elements.

FIG. 1 illustrates an embodiment of a memory system 110 which, for example, may be included in a computing device or a mobile device. The memory system may be included in or coupled to a host (e.g., host 102 of FIG. 2) and may perform data input/output (I/O) operations. The host may be, for example, a kind of external device operatively engaged with the memory system 110.

Referring to FIG. 1, the memory system 110 may include a controller 130 and a memory device 150. The controller 130 may output data, which is requested by the host 102 and delivered from the memory device 150, and/or may store data input from the host 102 in the memory device 150. The memory device 150 may include a plurality of non-volatile memory cells, each capable of storing data. The internal structure and/or configuration of the memory device 150 may vary depending on the intended application or desired performance of the memory device 150, which, in turn, may be based on the purpose(s) for which the memory system 110 is used or the requirement(s) of the host 102.

The controller 130 and the memory device 150 may be coupled through a plurality of data paths. For example, the memory device 150 may include a plurality of memory dies 240A, 240B, 240C, 240D, which may be coupled with the controller 130 through different data paths. For example, the first memory die 240A and the controller 130 are coupled through a first channel (CH1) and a first way (W1) CH1W1. The second memory die 240B and the controller 130 are coupled through the first channel (CH1) and a second way (W2) CH1W2. The first memory die 240A and the second memory die 240B may share the first channel CH1, but the first memory die 240A may use the first way W1 and the second memory die 240B may use the second way W2. That is, in an embodiment, the first memory die 240A and the second memory die 240B may independently use different ways W1, W2.

In addition, the third memory die 240C and the controller 130 are coupled through the second channel (CH2) and the first way (W1) CH2W1. The fourth memory die 240D and the controller 130 are coupled via the second channel (CH2) and the second way (W2) CH2W2. The number of channels and/or ways constituting the data paths between the controller 130 and the memory device 150 may vary depending, for example, on the number of memory dies in the memory device 150. The number of channels and ways connecting the memory dies 240A, 240B, 240C, 240D to the controller 130 may be different, for example, according to the intended application of the memory system 110 and/or requirement(s) of the host 102.

The plurality of memory dies 240A, 240B, 240C, 240D in the memory device 150 may be configured as different modules and may be independently coupled with the controller 130 via different data paths. When multiple data paths are used for data exchange, the plurality of memory dies 240A, 240B, 240C, 240D and the controller 130 may use an interleaving scheme via plural data paths for exchanging data to increase speed of data transfer.

For the interleaving scheme to enhance the speed of data transfer between the memory device 150 and the controller 130, data to be stored may be distributed over several modules rather than in a single module. In executing an interleaving scheme, a memory system may use an address limitation structure or an address scheme for distributing and storing a plurality of new data items over and in a plurality of modules of the memory device 150. For example, when programming four items of data, one type of memory system which has been proposed stores the four items of data in four memory dies individually, e.g., respectively. Here, the number of items of data may refer to the number of data units which may be stored together by a single program operation or a single write operation can be performed. For example, when a program operation (or a write operation) with a unit of page may be performed, four items of data may include an amount of data programmed in four pages.

In order to increase operational efficiency of program and read operations and enhance distributed storage, a memory system may employ an address limitation structure. In the address limitation structure, when four items of data are programmed in four memory dies, the same physical location in each memory die is allocated. For example, when storing the four items of data in the four memory dies, each of the four items of data is individually stored in the fifth physical location of a respective one of the four memory dies. Thereafter, when eight items of data are programmed, the eight items of data may be stored in the sixth and seventh physical locations of each memory die. The physical location may indicate a block or a page in a memory die.

When storing five items of data in four memory dies in a memory system with the address limitation structure, two items of data may be stored in first and second physical locations of the same memory die, and three items of data may be individually stored in a first physical location of the other three memory dies respectively. In the memory system with the address limitation structure, three items of dummy data are individually written in a second physical location of the remaining three memory dies because an item of data input along with the next program request cannot be written subsequently in the second physical location of the other three memory dies.

When a memory system has an address limitation structure for an interleaving operation, an operational efficiency may be degraded because items of dummy data may need to be programmed whenever a program operation with odd pieces of data is performed. In addition, because each memory die does not always have the same operation state (in terms of health, wear, etc.), the memory system might have to independently perform an additional operation to compensate for each memory die condition, which may increase processing overhead.

In accordance with one or more embodiments, the memory system 110 may adopt a full sync interleaving structure which is capable of supporting interleaving operations between the controller 130 and the memory device 150 without an address limitation structure. The full sync interleaving structure does not have an address limitation for storing data at the same location in each of a plurality of memory dies 240A, 240B, 240C, 240D in the memory device 150.

In operation, the controller 130 may distribute items of data to be programmed according to an operation condition and an operation state of each memory die. In doing so, the items of data need not be evenly distributed to each memory die. For example, if one of the four memory dies 240A, 240B, 240C, 240D (e.g., memory die 240A) cannot program an item of data immediately due to an internal operation being performed within, the controller 130 may transfer plural items of data into three other memory dies (e.g., 240B, 240C, 240D). The controller 130 may distribute plural items of data over the plurality of memory dies 240A, 240B, 240C, 240D to increase efficiency of data transmission and reduce an operation margin of a program operation, but a strict rule such as the address limitation structure does not apply. In addition, in the memory system 110 according to an embodiment, it is unnecessary to program dummy data, as is the case in a memory system with the address limitation structure.

After the controller 130 transfers an item of data to the memory device 150 and the item of data is programmed in the memory device 150, the controller 130 may generate or update map information associating a logical address with a physical location (e.g., a physical address) corresponding to the data. In addition, the controller 130 may store generated or updated map information in the memory device 150.

Because the memory system 110 does not adopt the address limitation structure as described above, it may be difficult to guarantee data transmission between the controller 130 and the memory device 150 in a process of reading and outputting plural items of data requested by a host (or an external device) performed in an interleaving manner (e.g., by an interleaving scheme). Accordingly, the controller 130 may include correlation circuitry 194 for correlating a plurality of read operations requested by the host, so that plural items of data output from the memory device 150 by the plurality of read operations may be transmitted using the interleaving scheme.

In FIG. 1, the controller 130 may include the correlation circuitry 194, operation control circuitry 196 and buffer control circuitry 198.

The buffer control circuitry 198 may control an input buffer and an output buffer. The input buffer is configured to temporarily store a command or an item of data which is input from the host. The output buffer is configured to temporarily store an item of data corresponding to a command input from the host before the item of data is transmitted to the host. For example, when the host sends read requests (or read commands) for reading plural items of data corresponding to 20 logical addresses to the memory system 110, the controller 130 receives the plural items of data corresponding to the 20 logical addresses from the memory device 150, temporarily stores the plural items of data in the output buffer, and outputs the plural items of data to the host. The buffer control circuitry 198 may monitor or recognize how many items of data are temporarily stored in the output buffer before output to the host.

The operation control circuitry 196 may check a physical location in the memory device 150, which corresponds to a logical address and read an item of data stored in the physical location. In response to a read request (or a read command) along with a logical address from an input buffer, the operation control circuitry 196 may translate the logical address into a physical address based on the map information and request an item of data (stored in nonvolatile memory cells indicated by the physical address) to the memory device 150. The physical address may indicate a specific physical location in the plurality of memory dies 240A, 240B, 240C, 240D in the memory device 150.

When the operation control circuitry 196 handles plural read requests according to an order or a sequence of the plural read request delivered by the buffer control circuitry 198, physical addresses corresponding to the plural read requests may be randomly distributed over the plurality of memory dies 240A, 240B, 240C, 240D. For example, three consecutive physical addresses may indicate different locations in the same memory die or four consecutive physical addresses may indicate different locations in different memory dies. In this situation, the data transmission between the controller 130 and the plurality of memory dies 240A, 240B, 240C, 240D may be sometimes performed in the interleaving manner, but it is often to exchange data between the controller 130 and the plurality of memory dies 240A, 240B, 240C, 240D randomly, not in the interleaving manner.

When the buffer control circuitry 198 determines that there are items of data to be output to the host in the output buffer, plural read requests (or plural read commands) and plural logical addresses from the host may be transmitted to the correlation circuitry 194. The correlation circuitry 194 may check map information regarding the plural logical addresses corresponding to the plural read requests from the buffer control circuitry 198 to correlate the plural read requests. As a result, the operation control circuitry 196 may perform plural read operations corresponding to the plural read requests according to the interleaving scheme, e.g., plural items of data are transferred in the interleaving manner between the controller 130 and the plurality of memory dies 240A, 240B, 240C, 240D.

A correlation operation performed by the correlation circuitry 194 may support parallel processing and distributed computing between the controller 130 and the plurality of memory dies 240A, 240B, 240C, 240D. In a circumstance where a single data path is shared by plural components, the plural components may interleave their signals or their data in the single data path. Further, in a circumstance where plural data paths are used by a single component, the single component may distribute plural signals or plural data over the plural data paths. The correlation operation may enable some of a plurality of read requests to be delivered into the plurality of memory dies in parallel through the plurality of channels, so that plural items of data corresponding to the plurality of read requests are output in parallel from the plurality of memory dies via the plurality of channels. The correlation operation for a plurality of read requests may controlling the transfer of plural items of data requested to the memory dies 240A, 2406, 240C, 240D from the memory device 150 to the controller 130 based on the interleaving manner.

For example, the correlation operation may include correlating read requests related to a physical location where interleaving among a plurality of read requests may be supported. The physical location supporting the interleaving may indicate physical locations through which different items of data can be transmitted and received through different channels or different ways. For example, the controller 130 may correlate requests for different planes in a die of the memory device 150 through the correlation operation and re-arrange correlated requests to be delivered into the memory device 150. The read requests may be delivered to the memory device 150 according to a correlated sequence, not an input sequence. In response to the requests transmitted through the correlation operation, the memory device 150 may output a result of each request within an operation margin which is established to handle a request.

According to an embodiment, the correlation operation may correlate different read requests based on an interleaving operation established in response to an internal configuration of the memory device 150. The memory device 150 may include a plurality of memory units. The memory unit can perform a data input/output operation individually and independently. Because each memory unit can perform a data input/output operation independently, the plurality of memory units can perform plural data input/output operations in parallel. For example, when the controller 130 controls the memory device 150 in an interleaving manner based on a plane including a buffer corresponding to a page size, the controller 130 may correlate read requests for data stored in different planes. If the memory device 150 can perform an interleaving operation based on a die, a channel or a way, the controller 130 may perform an operation to correlate a plurality of read requests related to different dies, different channels or different ways which support the interleaving operation.

In one case, a host may request 20 items of data stored in the memory system 110. The controller 130 may receive 20 read requests for the 20 items of data, which are input from the host. The buffer control circuitry 198 may transmit the 20 read requests for the 20 items of data to the correlation circuitry 194. The correlation circuitry 194 tries to correlate the 20 read requests so that at least some among the 20 items of data are output in the interleaving manner. For example, the correlation circuitry 194 may check a physical address corresponding to a first logical address input along with a first read request among the 20 read requests, and then recognize that first data corresponding to the first logical address is stored in the first memory die 240A. The correlation circuitry 194 may check a physical address corresponding to a second logical address input along with a second read request among the 20 read requests. When second data corresponding to the second read request is stored in the third memory die 240C or the fourth memory die 240D, an interleaving operation between the first and second read requests may be expected because the first data and the second data respectively corresponding to the first and second read requests may be transmitted via different channels CH1, CH2, Thus, the first and second read requests may be paired or correlated by the correlation circuitry 194 and paired or correlated read requests may be transmitted to the operation control circuitry 196.

If the second data is stored in the first memory die 240A or the second memory die 240B, the interleaving operation between the first and second read requests may not be expected because the first data and the second data respectively corresponding to the first and second read requests may be transmitted via the same channels CH1. In this case, the correlation circuitry 194 may not pair or correlate the first and second read requests. Then, the correlation circuitry 194 may check a physical address for a third read request. When third data corresponding to the third read request is stored in the third memory die 240C or the fourth memory die 240D, the interleaving operation between the first request and the third request may be expected because the first data and the third data respectively corresponding to the first and third read requests may be transmitted via different channels CH1, CH2. The correlation circuitry 194 may correlate the first read request and the third read request and transmit correlated read request to the operation control circuitry 196. The third read request may be transmitted earlier than the second read request.

If the third data is stored in the first memory die 240A or the second memory die 240B, the interleaving operation between the first request and the third request may not be expected because the first and third data are transmitted via the same channel. Then, the correlation circuitry 194 may check a physical address for a fourth read request.

As described above, the correlation circuitry 194 may check the physical location where data corresponding to a read request is stored, correlate some of read requests when an interleaving operation between the read requests may be expected, and transfer correlated read requests to the operation control circuitry 196. For the correlation operation, the correlation circuitry 194 may refer to map information in the controller 130 or loaded in a memory or a buffer of controller 130.

The correlation operation with respect to a plurality of read requests, which is performed by the correlation circuitry 194, may adversely affect data input/output performance such as I/O throughput of the memory system 110 because the correlation operation may cause a delay. Accordingly, the correlation circuitry 194 may not perform the correlation operation for all read requests from the host. For example, the buffer control circuitry 198 may check items of data in the output buffer, which are output to the host, to determine whether the data input/output performance of the memory system 110 would not be degraded if the correlation circuitry 194 performs the correlation operation to the plurality of read requests. The correlation circuitry 194 may perform the correlation operation regarding the plurality of read requests in a situation where it is determined that the correlation operation has no or little impact on the I/O throughput.

The correlation circuitry 194 may not correlate all of the plurality of read requests from the buffer control circuitry 198. When the interleaving operation may be expected considering the physical locations of the items of data corresponding to the plurality of read requests, the correlation circuitry 194 may perform the correlation operation. But, other read requests, received after these read requests are correlated by the correlation circuitry 194 may be transferred uncorrelated to the operation control circuitry 196.

In response to an operation environment, the controller 130 may correlate at least some of the plurality of read requests from the host, so that plural items of data are transferred based on the interleaving scheme between the memory device 150 and the controller 130. In addition, the memory system 110 does not have to adopt an address limitation structure for exchanging signals or data using the interleaving manner within the memory system 110. Plural items of data may be distributed and stored based on operation environment and operation states of the plurality of memory dies 240A, 2406, 240C, 240D in the memory device 150. The controller 130 may attempt to correlate read requests for reading plural items of data stored in the plurality of memory dies 240A, 240B, 240C, 240D in memory device 150.

Because the memory system 110 does not have to use the address limitation structure, the plurality of memory dies 240A, 2406, 240C, 240D in the memory device 150 may be operated more efficiently. Additionally, the lifespans of the memory dies 240A, 240B, 240C, 240D in the memory device 150 may be improved. On the other hand, since data transfer between the plurality of memory dies 240A, 2406, 240C, 240D and the controller 130 may be performed based on the interleaving scheme, the memory system 110 according to an embodiment can avoid deteriorating the data input/output performance (e.g., I/O throughput) thereof.

Figure 2:
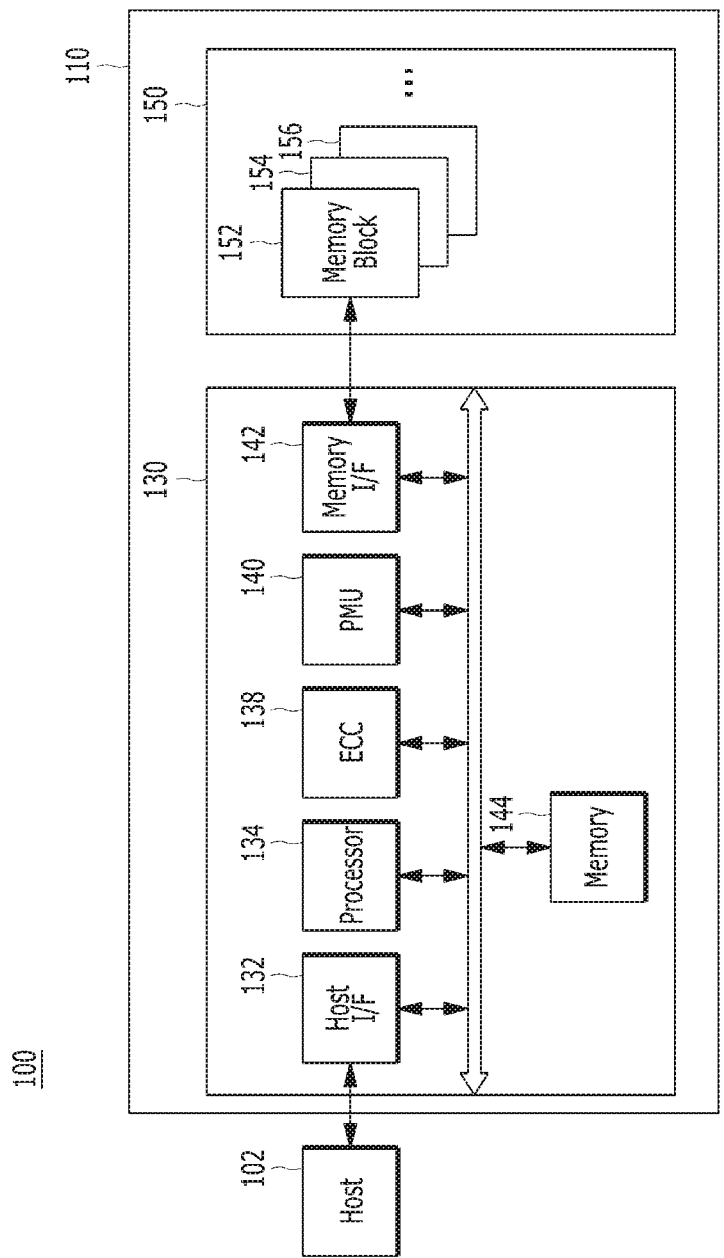
FIG. 2 illustrates a data processing system according to an embodiment.

FIG. 2 illustrates a data processing system 100 according to an embodiment. The data processing system 100 may include a host 102 engaged or operably coupled with memory system 110.

The host 102 may include, for example, any of a variety of portable electronic devices. Examples include a mobile phone, MP3 player, laptop computer, desktop computer, game player, television, a projector, or another device or system. The host 102 also includes at least one operating system (OS), which can manage and/or control functions and operations performed in the host 102. In one embodiment, the OS may provide interoperability between the host 102 engaged with the memory system 110 and the user of the memory system 110. The OS may support functions and operations corresponding to user requests.

Figure 4:
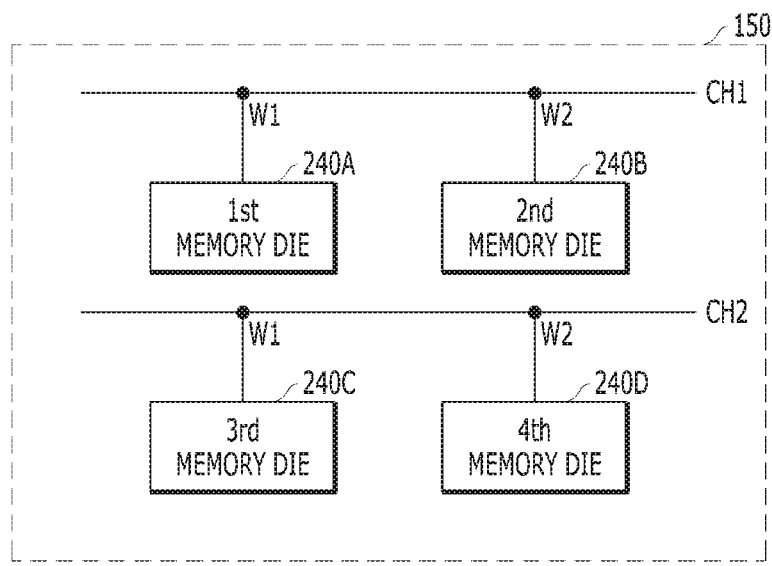
FIG. 4 illustrates a memory device in a memory system according to an embodiment.
Figure 5:
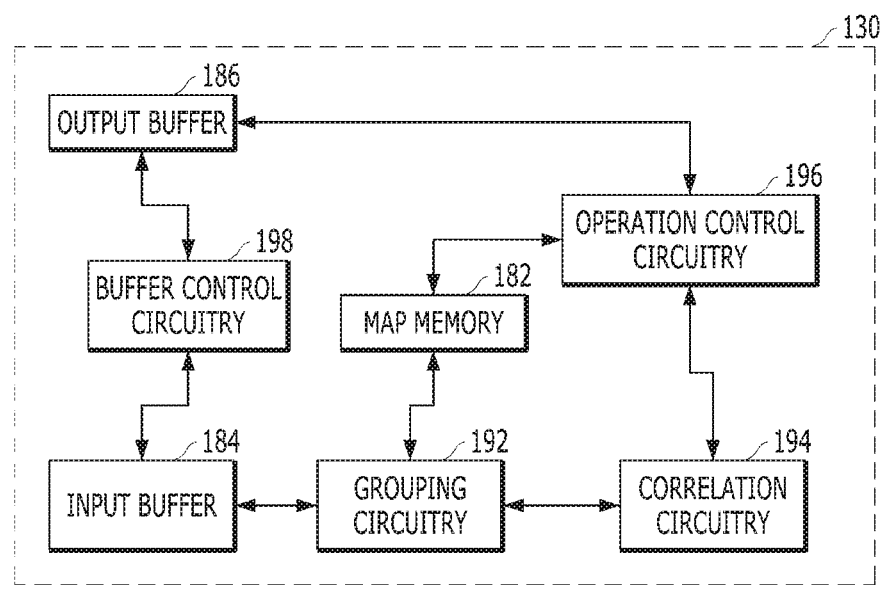
FIG. 5 illustrates a controller according to an embodiment.

By way of example but not limitation, the OS may include a general operating system and a mobile operating system according to mobility of the host 102. The general operating system may be split into a personal operating system and an enterprise operating system according to system requirements or user environment. The personal operating system (e.g., Windows, Chrome, etc.) may be subject to support services for general purposes. In some cases, the enterprise operating systems may be specialized for securing and supporting high performance, including Windows servers, Linux and Unix. Further, the mobile operating system may include an Android, an iOS and a Windows mobile. The mobile operating system may be subject to support services or functions for mobility (e.g., a power saving function). The host 102 may include a plurality of operating systems. For example, the host 102 may execute multiple operating systems in cooperation with the memory system 110, corresponding to a user request. The host 102 may transmit a plurality of commands corresponding to the user's requests into the memory system 110, thereby performing operations corresponding to commands within the memory system 110. FIGS. 4 and 5 illustrate example embodiments for handling plural commands in the memory system 110.

The memory system 110 may perform a specific function or operation in response to a request from the host 102, e.g., may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card and a memory stick.

The storage devices for the memory system 110 may be implemented with a volatile memory device. Examples include a dynamic random access memory (DRAM) or a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) or a flash memory.

The memory system 110 may include a controller 130 and a memory device 150. The memory device 150 may store data to be accessed by the host 102. The controller 130 may control storage of data in the memory device 150. In one embodiment, the controller 130 and the memory device 150 may be integrated into a single semiconductor device, which may be included in any of the various types of memory systems as exemplified above. By way of example but not limitation, the controller 130 and the memory device 150 may be integrated into a single semiconductor device. The controller 130 and memory device 150 may be integrated to form an SSD for improving operation speed. When the memory system 110 is used as an SSD, the operating speed of the host 102 connected to the memory system 110 can be improved more than that of the host 102 connected with a hard disk. In another embodiment, the controller 130 and the memory device 150 may be integrated into one semiconductor device to form a memory card, such as a PC card (PCMCIA), a compact flash card (CF), a smart media card (e.g., SM, SMC), a memory stick, a multimedia card (e.g., MMC, RS-MMC, MMCmicro), a secure digital (SD) card (e.g., SD, miniSD, microSD, SDHC), or a universal flash memory.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while electrical power is not supplied. The memory device 150 may store data provided from the host 102 through a write operation, while providing data stored therein to the host 102 through a read operation. The memory device 150 may include a plurality of memory blocks 152, 154, 156, each of which may include a plurality of pages. Each of the plurality of pages may include a plurality of memory cells to which a plurality of word lines (WL) are electrically coupled. The memory device 150 also includes a plurality of memory dies, each of which includes a plurality of planes, each of which includes memory blocks, among the plurality of memory blocks 152, 154, 156. In addition, the memory device 150 may be a non-volatile memory device, for example a flash memory, wherein the flash memory may be a three-dimensional stack structure.

The controller 130 may control overall operations of the memory device 150, e.g., read, write, program and erase operations. For example, the controller 130 may control the memory device 150 in response to a request from the host 102. The controller 130 may provide the data, read from the memory device 150, with the host 102. The controller 130 may store the data, provided by the host 102, into the memory device 150.

The controller 130 may include a host interface (I/F) 132, a processor 134, an error correction code (ECC) circuitry 138, a power management unit (PMU) 140, a memory interface (I/F) 142 and a memory 144, all operatively coupled via an internal bus.

The host interface 132 may process commands and data provided from the host 102 and may communicate with the host 102 through at least one of various interface protocols. Examples include universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE). In accordance with an embodiment, the host interface 132 is a component for exchanging data with the host 102, which may be implemented through firmware called a host interface layer (HIL).

The ECC circuitry 138 may correct error bits of the data to be processed in (e.g., output from) the memory device 150, which may include an ECC encoder and an ECC decoder. The ECC encoder may perform error correction encoding of data to be programmed in the memory device 150, in order to generate encoded data into which one or more parity bits are added. The encoded data may be stored in memory device 150. The ECC decoder may detect and correct errors in data read from the memory device 150 when the controller 130 performs a read operation. For example, after performing error correction decoding on data read from the memory device 150, the ECC circuitry 138 may determine whether the error correction decoding has succeeded and output a corresponding instruction signal (e.g., a correction success signal or a correction fail signal). The ECC circuitry 138 may use the parity bit(s) generated during the ECC encoding process for correcting the error bit(s) of the read data. When the number of the error bits is greater than or equal to a threshold number of correctable error bits, the ECC circuitry 138 may not correct error bits. Instead, the ECC circuitry 138 may output an error correction fail signal indicating failure in correcting the error bits.

The ECC circuitry 138 may perform an error correction operation based on a coded modulation. Examples include a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), or a Block coded modulation (BCM). The ECC circuitry 138 may include one or more circuits, modules, systems, devices, or other forms of logic for performing the error correction operation based on at least one of the above described codes.

The PMU 140 may manage an electrical power provided in the controller 130. For example, the PMU 140 may detect the power-on 312 and the power-off 314 described in FIG. 1. In addition, the PMU 140 may include a power detector.

The memory interface 142 may serve as an interface for handling commands and data transferred between the controller 130 and the memory device 150, in order to allow the controller 130 to control the memory device 150 in response to a request delivered from the host 102. The memory interface 142 may generate a control signal for the memory device 150 and process data entered into or output from the memory device 150 under the control of the processor 134 when the memory device 150 is a flash memory, e.g., a NAND flash memory. The memory interface 142 may provide an interface for handling commands and data between the controller 130 and the memory device 150, The memory interface 142 may, for example, be a NAND flash interface that handles or manages operations between the controller 130 and the memory device 150. In accordance with an embodiment, the memory interface 142 may be implemented through firmware (e.g., a flash interface layer (FIL)) serving as a component for exchanging data with the memory device 150.

The memory 144 may support operations performed by the memory system 110 and the controller 130, The memory 144 may store temporary or transactional data generated or delivered for operations in the memory system 110 and the controller 130. The controller 130 may control the memory device 150 in response to a request from the host 102. The controller 130 may deliver data read from the memory device 150 into the host 102. The controller 130 may store data entered through the host 102 within the memory device 150. The memory 144 may be used to store data required for the controller 130 and the memory device 150 to perform operations such as read operations or program/write operations.

In one embodiment, the memory 144 may be implemented with a volatile memory. For example, the memory 144 may be implemented with a static random access memory (SRAM), a dynamic random access memory (DRAM), or both. Although in FIG. 1 the memory 144 is in the controller 130, the memory 144 may be external to the controller 130 in another embodiment. In one example implementation, the memory 144 may be embodied by an external volatile memory having a memory interface transferring data and/or signals between the memory 144 and the controller 130.

The memory 144 may store data for performing operations (such as data writing and data reading) requested by the host 102 and/or data transfer between the memory device 150 and the controller 130 for background operations such as garbage collection and wear levelling as described herein. In accordance with an embodiment, in order to support operations in the memory system 110, the memory 144 may include, for example, a program memory, a data memory, a write buffer/cache, a read buffer/cache, a data buffer/cache and a map buffer/cache.

The processor 134 may be implemented with a microprocessor or a central processing unit (CPU). The memory system 110 may include one or more processors 134. The processor 134 may control the overall operations of the memory system 110. By way of example but not limitation, the processor 134 can control a program operation or a read operation of the memory device 150 in response to a write request or a read request entered from the host 102. In accordance with an embodiment, the processor 134 may use or execute firmware and/or other instructions to control overall operations of the memory system 110. In one embodiment, the firmware and/or instructions may correspond to a flash translation layer (FTL) which serves as an interface between the host 102 and the memory device 150. The host 102 may transmit requests for write and read operations to the memory device 150 through the FTL.

The FTL may manage operations of address mapping, garbage collection, wear-leveling and/or other operations. In one embodiment, the FTL may load, generate, update, or store map data. In these or other cases, the controller 130 may map a logical address (received from host 102) to a physical address of the memory device 150 based on the map data. In some cases, the memory device 150 may function as a general storage device to perform a read or write operation based on the address mapping operations. Also, through address mapping operations performed based on the map data, when the controller 130 tries to update data stored in a particular page, the controller 130 may program the updated data on another empty page and may invalidate old data of the particular page (e.g., update a physical address, corresponding to a logical address of the updated data, from the particular page to the newly programed page) based on characteristics of a flash memory device. Further, the controller 130 may store map data of the new data into the FTL.

For example, when performing an operation requested from the host 102 in the memory device 150, the controller 130 uses the processor 134. The processor 134, engaged with the memory device 150, may handle instructions or commands corresponding to an input command from the host 102. The controller 130 may perform a foreground operation as a command operation corresponding to a command from the host 102. Examples of the command operation include a program operation corresponding to a write command, a read operation corresponding to a read command, an erase/discard operation corresponding to an erase/discard command and a parameter set operation corresponding to a set parameter command or a set feature command with a set command.

For another example, the controller 130 may perform a background operation on the memory device 150 through the processor 134. By way of example but not limitation, the background operation for the memory device 150 includes copying data in a memory block (among the memory blocks 152, 154, 156) and storing such data in another memory block (e.g., a garbage collection (GC) operation). The background operation may include an operation to move data (stored in at least one of the memory blocks 152, 154, 156 in the memory device 150) into at least another of the memory blocks 152, 154, 156 (e.g., a wear leveling (WL) operation). During a background operation, the controller 130 may use the processor 134 for storing the map data stored in the controller 130 to at least one of the memory blocks 152, 154, 156, e.g., a map flush operation. A bad block management operation of checking for bad blocks among the plurality of memory blocks 152, 154, 156 is another example of a background operation performed by the processor 134.

In the memory system 110, the controller 130 performs a plurality of command operations corresponding to a plurality of commands received from the host 102. For example, when performing program operations, read operations and/or erase operations that are based on corresponding program commands, read commands, and/or erase commands, the controller 130 may determine the channel(s) or way(s) that are appropriate or proper for connecting the controller 130 to memory die(s) in the memory 150. The program, read, and/or erase operations may be performed in a sequential, random, or alternating pattern. The controller 130 may send or transmit data or instructions via determined the channel(s) or way(s) for performing each operation. The plurality of memory dies may transmit an operation result via the same channel(s) or way(s), respectively, after each operation is complete. Then, the controller 130 may transmit a response or an acknowledge signal to the host 102. In an embodiment, the controller 130 may check the status of each channel or each way. In response to a command received from the host 102, the controller 130 may select at least one channel or way based on the status of each channel or each way, so that instructions and/or operation results with data may be delivered via selected channel(s) or way(s).

By way of example but not limitation, the controller 130 may recognize statuses regarding channels (or ways) associated with memory dies in the memory device 150. The controller 130 may determine each channel or way as being in a busy state, a ready state, an active state, an idle state, a normal state, or an abnormal state. The determination by the controller of which channel or way through which an instruction (and/or a data) is delivered can be based on a physical block address, e.g., to which die(s) the instruction (and/or the data) is delivered. In one embodiment, the controller 130 may refer to descriptors delivered from the memory device 150. The descriptors may include a block or page of parameters that describe informative items about the memory device 150, which is a data with a set format or structure. For instance, the descriptors may include device descriptors, configuration descriptors, unit descriptors, and the like. The controller 130 can refer to, or use the descriptors to determine with which channel(s) or way(s) an instruction or a data is exchanged.

A management unit may be included in the processor 134 to perform bad block management of the memory device 150. For example, the management unit may find bad memory blocks which are in unsatisfactory condition for further use and in some cases perform bad block management on the bad memory blocks. When the memory device 150 is a flash memory (e.g., a NAND flash memory), a program failure may occur during the write operation (e.g., during the program operation) due to characteristics of a NAND logic function. During the bad block management, the data of the program-failed memory block or the bad memory block may be programmed into a new memory block. The bad blocks may seriously aggravate the utilization efficiency of the memory device 150 having a 3D stack structure and the reliability of the memory system 110. Thus, reliable bad block management may enhance or improve performance of the memory system 110.

Figure 3:
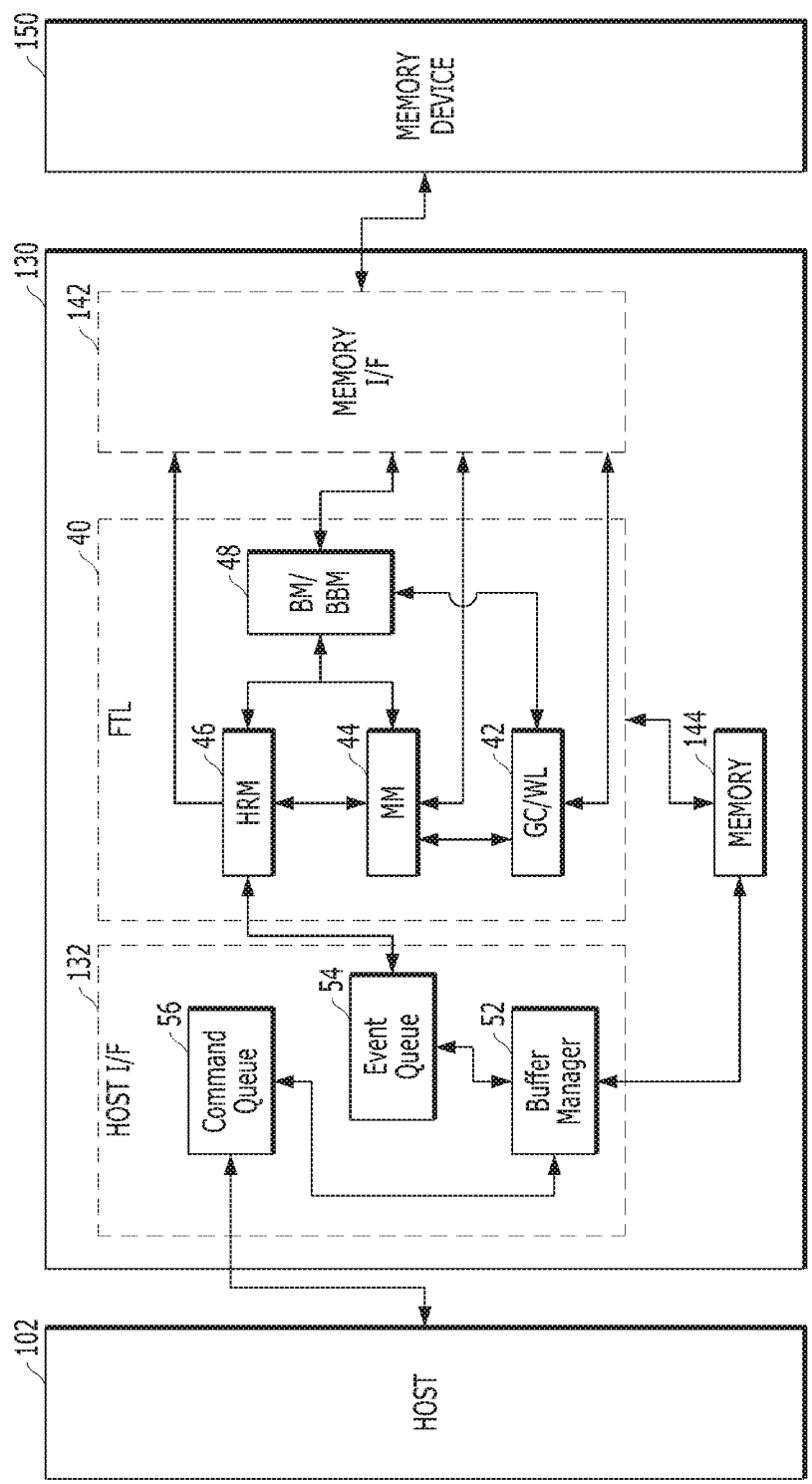
FIG. 3 illustrates a controller in a memory system according to an embodiment.

FIG. 3 illustrates a controller 130 in a memory system according to an embodiment. Referring to FIG. 3, the controller 130 operates along with the host 102 and the memory device 150. The controller 130 may include a host interface (I/F) 132, a flash translation layer (FTL) circuitry 40, a memory interface (I/F) 142 and a memory 144.

In accordance with an embodiment, the ECC circuitry 138 in FIG. 2 may be included in the flash translation layer (FTL) circuitry 40. In another embodiment, the ECC circuitry 138 may be implemented as a separate module, a circuit, or firmware, which is included in, or associated with, the controller 130.

The host interface 132 is for handling commands and data from the host 102. By way of example but not limitation, the host interface 132 may include a command queue 56, a buffer manager 52 and an event queue 54. The command queue 56 may sequentially store commands and data from the host 102 and output them to the buffer manager 52 in a stored order. The buffer manager 52 may classify, manage, or adjust the commands and the data which are delivered from the command queue 56. The event queue 54 may sequentially transmit events for processing the commands and data from buffer manager 52.

A plurality of commands or data of the same characteristic(s) may be continuously received from the host 102, or commands and data of different characteristics may be transmitted to the memory system 110 after being mixed or jumbled. For example, a plurality of commands for reading data (e.g., read commands) may be delivered, or read commands and program/write commands may be alternately transmitted to the memory system 110. The host interface 132 may store commands and data received from the host 102 to the command queue 56 sequentially. Thereafter, the host interface 132 may estimate or predict what kind of internal operation the controller 130 will perform according to the characteristics of the command and data received from the host 102.

The host interface 132 may also determine a processing order and a priority of commands and data based at least on their characteristics. According to characteristics of commands and data from the host 102, the buffer manager 52 in the host interface 132 may be configured to determine whether the buffer manager 52 should store commands and data in the memory 144 or whether the buffer manager 52 should deliver the commands and the data into the flash translation layer (FTL) circuitry 40. The event queue 54 receives events from the buffer manager 52 (to be internally executed and processed by the memory system 110 or controller 130 in response to the commands and data from the host 102) and delivers the events to the flash translation layer (FTL) circuitry 40 in the order received.

In accordance with an embodiment, the host interface 132 in FIG. 3 may perform the functions of the controller 130 in FIG. 1. For example, the flash translation layer (FTL) circuitry 40 may include a state manager (GC/WL) 42, a map manager (MM) 44, a host request manager (HRM) 46, and a block manager (BM/BBM) 48. The host request manager 46 may manage the events entered from the event queue 54. The map manager 44 may handle or control a map data. The state manager 42 may perform garbage collection (GC) or wear leveling (WL). The block manager 48 may execute commands or instructions onto a block in the memory device 150.

By way of example but not limitation, the host request manager 46 may use the map manager 44 and the block manager 48 to handle or process requests according to the read and program commands and events which are delivered from the host interface 132. The host request manager 46 may send an inquiry request to the map data manager 44, in order to determine a physical address corresponding to the logical address which is entered with the events. The host request manager 46 may send a read request with the physical address to the memory interface 142, in order to process the read request (handle the events). On the other hand, the host request manager 46 may send a program request (or write request) to the block manager 48, in order to program entered data to an empty page (e.g., a page having no data) in the memory device 150. Then, the host request manager 46 may transmit a map update request corresponding to the program request to the map manager 44 in order to update an item relevant to the programmed data in information of mapping the logical-physical addresses to each other.

The block manager 48 may convert a program request (delivered from the host request manager 46, the map data manager 44, and/or the state manager 42) to a flash program request used for the memory device 150, in order to manage flash blocks in the memory device 150. In order to maximize or enhance program or write performance of the memory system 110 (e.g., see FIG. 2), the block manager 48 may collect program requests and send flash program requests for multiple-plane and one-shot program operations to the memory interface 142. The block manager 48 may send several flash program requests to the memory interface 142 to enhance or maximize parallel processing of the multi-channel and multi-directional flash controller.

The block manager 48 may be configured to manage blocks in the memory device 150 according to the number of valid pages, select and erase blocks having no valid pages when a free block is needed, and select a block including the least number of valid pages when it is determined that garbage collection is to be performed. The state manager 42 may perform garbage collection in order to move the valid data to an empty block and erase remaining data in the blocks from which the valid data was moved, so that the block manager 48 may have enough free blocks (e.g., empty blocks with no data). If the block manager 48 provides information regarding a block to be erased to the state manager 42, the state manager 42 is able to check all flash pages of the block to be erased to determine whether each page is valid.

For example, to determine validity of each page, the state manager 42 may identify a logical address stored in an out-of-band (OOB) area of each page. To determine whether each page is valid, the state manager 42 may compare the physical address of the page with the physical address mapped to the logical address obtained from the request. The state manager 42 sends a program request to the block manager 48 for each valid page. A mapping table may be updated through the update of the map manager 44 when the program operation is complete.

The map manager 44 may manage a logical-physical mapping table and may process requests (e.g., queries and updates) generated by the host request manager 46 or the state manager 42. The map manager 44 may also store the entire mapping table in the memory device 150 (e.g., a flash/non-volatile memory) and cache mapping entries according to the storage capacity of the memory 144. When a map cache miss occurs while processing inquiry or update requests, the map manager 44 may send a read request to the memory interface 142 to load a relevant mapping table stored in the memory device 150. When the number of dirty cache blocks in the map manager 44 exceeds a certain threshold, a program request may be sent to the block manager 48 so that a clean cache block is made and the dirty map table may be stored in the memory device 150.

When garbage collection is performed, the state manager 42 copies valid page(s) into a free block, and the host request manager 46 may program the latest version of the data for the same logical address of the page and currently issue an update request. When the state manager 42 requests a map update in a state in which copying of valid page(s) has not been completed, the map manager 44 may not perform the mapping table update. This is because the map request is issued with old physical information if the state manger 42 requests a map update and a valid page copy is not completed until later. In one embodiment, the map manager 44 may perform a map update operation to ensure accuracy only if the latest map table still points to the old physical address.

In accordance with an embodiment, the FTL circuitry 40 may include the correlation circuitry 194 shown in FIG. 1, and the memory interface 142 may include the operation control circuitry 196 and the buffer control circuitry 198 shown in FIG. 1. In another embodiment, the memory interface 142 includes the correlation circuitry 194, the operation control circuitry 196 and the buffer control circuitry 198 shown in FIG. 1.

The memory device 150 may include a plurality of memory blocks. Each of the plurality of memory blocks may be a single level cell (SLC) memory block or a multi level cell (MLC) memory block based on the number of bits that can be stored or represented in one memory cell of such block. The SLC memory block may include a plurality of pages implemented by memory cells, each storing one bit of data. The SLC memory block can have high data I/O operation performance and high durability.

The MLC memory block includes a plurality of pages implemented by memory cells, each storing multi-bit data (e.g., two bits or more). The MLC memory block can have a larger storage capacity for the same space compared to the SLC memory block. The MLC memory block can be highly integrated in terms of storage capacity.

In an embodiment, the memory device 150 may be implemented with MLC memory blocks, such as a double level cell memory block, a triple level cell (TLC) memory block, a quadruple level cell (QLC) memory block and a combination thereof. The double level memory block may include a plurality of pages implemented by memory cells, each capable of storing 2-bit data. The triple level cell (TLC) memory block may include a plurality of pages implemented by memory cells, each capable of storing 3-bit data. The quadruple level cell (QLC) memory block may include a plurality of pages implemented by memory cells, each capable of storing 4-bit data. In another embodiment, the memory device 150 may be implemented with a block including a plurality of pages implemented by memory cells, each capable of storing 5-bit or more bit data.

In an embodiment, the memory device 150 is embodied as a nonvolatile memory such as a flash memory such as a NAND flash memory, a NOR flash memory and the like. In another embodiment, the memory device 150 may be implemented by at least one of a phase change random access memory (PCRAM), a ferroelectrics random access memory (FRAM) and a spin injection magnetic memory (e.g., a spin transfer torque magnetic random access memory (STT-MRAM)).

FIG. 4 illustrates an internal configuration of memory device 150 in a memory system in accordance with an embodiment. Referring to FIG. 4, the memory device 150 may include the plurality of memory dies 240A, 2406, 240C, 240D. The first memory die 240A and the second memory die 2406 may be connected to the controller 130 (e.g., see FIGS. 1 through 3) through the first channel CH #1. The third memory die 240C and the fourth memory die 240D may be connected to the controller 130 through the second channel CH #2.

In FIG. 4, four memory dies 240A, 2406, 240C, 240D are coupled to the controller 130 through two channels CH #1, CH #2 (e.g., CH1 and CH2 of FIG. 4) is described. In another embodiment, a different number of dies may be coupled to the controller through the same or a different number of channels, or the same or different number of dies may be coupled to the controller through the same number of channels. Even though the memory device 150 may include at least two dies and at least two channels, the number of dies and channels in a given configuration depends on the various factors, such as but not limited to the overall configuration of the memory system, the purpose(s) for which it is employed, and/or the specification defining communication between the memory system and the engaged host.

When a plurality of memory dies is connected to a single channel, each memory die may be coupled with the channel through different ways. In FIG. 4, the first memory die 240A and the second memory die 240B may be coupled with the first channel CH #1 through the first way W1 and the second way W2, individually. The third memory die 240C and the fourth memory die 240D may be coupled with the second channel CH #2 through the first way W1 and the second way W2, individually. In this particular configuration, the number of ways is the same as the number of memory dies. The number of ways may be different from the number of memory dies in another embodiment.

FIG. 5 illustrates an internal configuration of the controller 130 according to an embodiment. Referring to FIG. 5, the controller 130 may include the correlation circuitry 194, the operation control circuitry 196 and the buffer control circuitry 198 shown in FIG. 1, as well as grouping circuitry 192. For example, the buffer control circuitry 198, the correlation circuitry 194, and the operation control circuitry 196 may be operatively engaged with an output buffer 186, an input buffer 184 and a map memory 182 to proceed with or stop the correlation operation. The grouping circuitry 192 may determine whether to load map addresses or map data in the map memory 182 after the correlation circuitry 194 determines whether to perform a correlation operation for plural requests.

The controller 130 may translate a logical address input from the host 102 (e.g., see FIGS. 2 and 3) into a physical address indicating a physical location in the memory device 150 (e.g., see FIGS. 1 to 4). The controller 130 may load the map data and the map information stored in the memory device 150 for performing address translation.

According to an embodiment, when there is sufficient storage space in the memory 144 (e.g., see FIGS. 2 and 3), which is included in the controller 130 or operably engaged with the controller 130, all map data or all map information used for address translation may be loaded once. However, when the memory system 110 (e.g., see FIGS. 1 to 3) is mounted in a portable terminal, the controller 130 may not have sufficient storage space to store all of the map data or map information. In this case, the controller 130 may retrieve specific map data (e.g., some or a predetermined amount of map data) from the memory device 150, use or update the retrieved map data, store updated map data in the memory device 150, and retrieve other map data stored in the memory device 150. According to an embodiment, a pre-allocated space in the memory 144 may be utilized for storing map data or map information.

If the requested map data cannot be stored in a region of the memory 144, the controller 130 may remove the least recently used (LRU) map data in the region based on an LRU replacement scheme. As another example, when the requested map data cannot be stored in the region of the memory 144, the controller 130 may remove the least frequently used (LFU) map data in the region based on an LFU replacement scheme. The controller 130 requests the map data or map information for performing address translation from the memory device 150, which incurs processing overhead, so that overall performance or I/O throughput of the memory system 110 may be degraded. Thus, it may be desirable to avoid unnecessary replacement of map data and map information.

Before a correlation operation for a plurality of read requests is performed, the grouping circuitry 192 may use logical addresses input with the plurality of read requests to check whether map data associated with the logical addresses is loaded in the map memory 182. If the map data associated with the corresponding logical address is located in the map memory 182, the correlation circuitry 194 may perform the correlation operation without requesting additional map data, and the operation control circuitry 196 may perform address translation for correlated requests. However, if the map data associated with the corresponding logical address is not loaded in the map memory 182, the correlation circuitry 194 may perform the correlation operation after the map data is loaded in the map memory 182 from the memory device 150. In this case, the operation control circuitry 196 may delay the address translation until at least some requests are correlated based on the map data, and may then perform the pairing operation and address. The grouping circuitry 192 may determine whether the controller 130 issues or generates a request for map data based on map data or map information currently loaded in the map memory 182.

For example, when there are 20 read requests for correlation, the controller 130 may check the map memory 182 based on logical addresses associated with the 20 read requests. If map addresses or map data relevant to 11 of the read requests are found in the map memory 182 and map data or map addresses relevant to 9 read requests are not found in the map memory 182, the grouping circuitry 192 may classify the 11 read requests into a map hit group and the 9 read requests into a map miss group. After classifying plural requests into the map hit group and the map miss group, the grouping circuitry 192 may transmit the map hit group and the map miss group to the correlation circuitry 194.

Additionally, the correlation circuitry 194 may perform a first correlation operation on read requests of the map hit group. Subsequently, the correlation circuitry 194 may perform a second correlation operation on both a read request not correlated in the map hit group through the first correlation operation and one or more read requests in the map miss group. Between the first correlation operation and the second correlation operation, the controller 130 may perform a process or operation for requesting map data associated with the one or more read requests in the map miss group to the memory device 150 and loading the map data in the map memory 182 from the memory device 150.

The controller 130 may include the output buffer 186, the input buffer 184, and the map memory 182. According to an embodiment, the output buffer 186, the input buffer 184, and the map memory 182 may be functional modules implemented with memory 144, for example, as described with reference to FIGS. 2 to 3. The output buffer 186, the input buffer 184, and the map memory 182 may be implemented with a single volatile memory device or plural, separate volatile memory devices.

In an embodiment, the output buffer 186, the input buffer 184 and the map memory 182 may be implemented with a plurality of cache memories. For example, each of the output buffer 186 and the input buffer 184 may have a data structure such as a queue. In this case, the output buffer 186 and the input buffer 184 may output an item of data according to the stored order of data (e.g., first-in first-out, FIFO). The map memory 182 may have various structures according to map data, and storage structure and management rule regarding map information.

Figure 6:
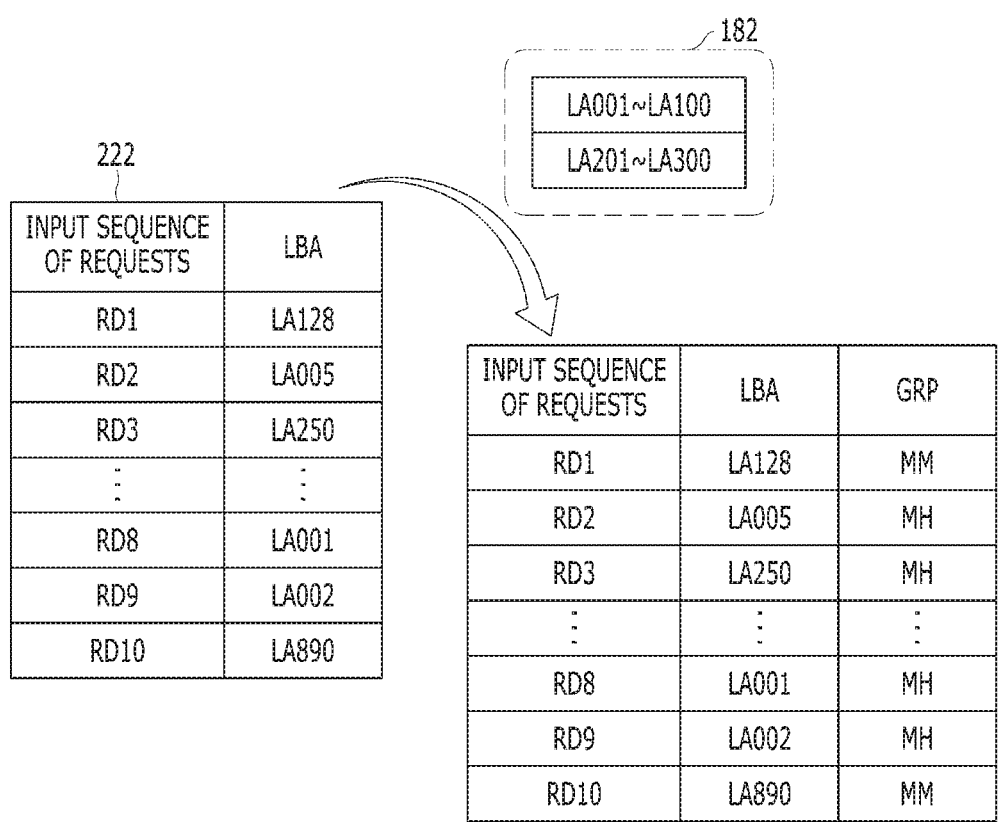
FIG. 6 illustrates a method for controlling a memory system according to an embodiment.

FIG. 6 illustrates an example embodiment of a first operation performed by the controller 130 regarding a plurality of read requests. In this case, the first operation may be performed by the grouping circuitry 192 shown in FIG. 5.

Referring to FIG. 6, it is assumed that a plurality of read requests 222 from the host 102 (e.g., an external device) are stored in the input buffer 184. The plurality of read requests 222 stored in the input buffer 184 may be sorted, for example, according to the order in which they are received from the host 102. In the illustrated embodiment, the plurality of read requests 222 includes ten read requests RD1 to RD10. Also, it may be assumed that, before the 10 read requests RD1 to RD10 are correlated, plural segments of map information or map data for some logical addresses LA001 to LA100, LA201 to LA300 are loaded in the map memory 182.

After checking the map memory 182, the grouping circuitry 192 may divide 10 read requests RD1 to RD10 into two groups. For example, the logical address input with the first read request RD1 is 'LA128', which belongs to the logical address range of LA101 to 200 that is not loaded in the map memory 182. Therefore, in order to correlate the first read request RD1 with another read request, another segment of map data and map information would be requested from the memory device 150 (e.g., see FIGS. 1 to 4). The grouping circuitry 192 may classify the first read request RD1 into a map miss group MM.

The logical address input with the second read request RD2 is 'LA005', which belongs to the logical address range of LA001 to 100 that is already loaded in the map memory 182. Therefore, because it is not necessary to issue or generate a request for loading another segment of map data and map information from memory device 150 to correlate the second read request RD2 with another read request, the second read request RD2 may be classified into a map hit group MH.

In the above-described manner, the controller 130 may classify each of the 3rd read request RD3 to the 10th read request RD10 into one of the map miss group MM and the map hit group MH. For example, the second, third, eighth, and ninth read requests RD2, RD3, RD8, RD9 may be classified into the map hit group MH, while the first and tenth read request RD1, RD10 may be classified into the map miss group MM.

Figure 7:
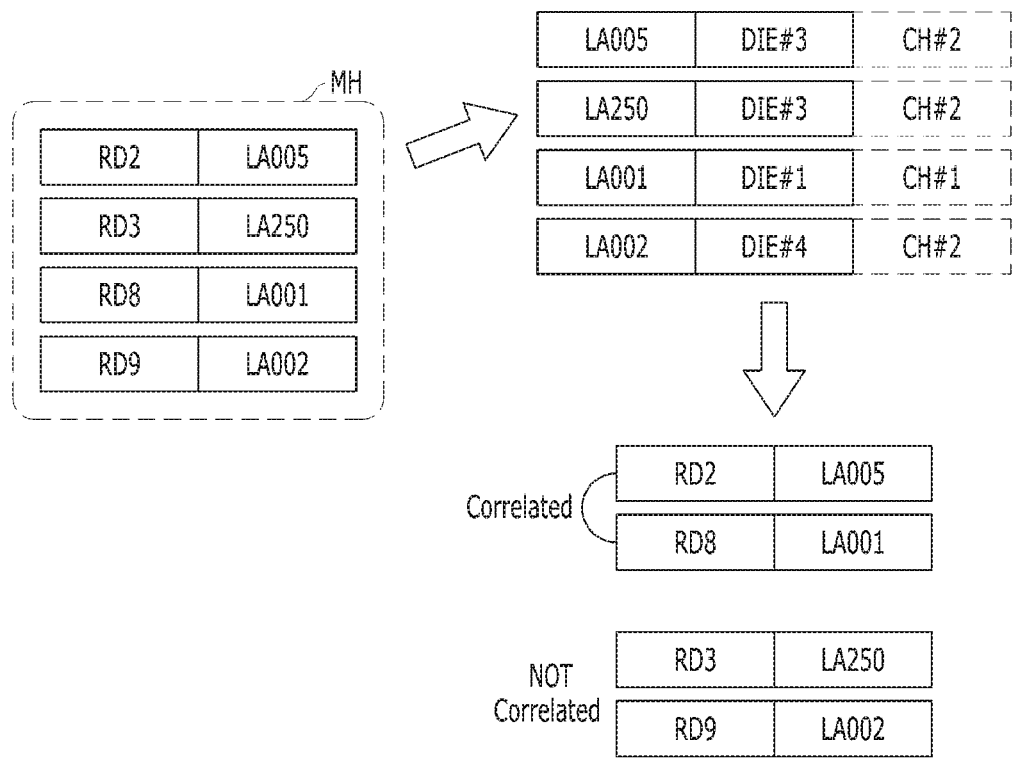
FIG. 7 illustrates a method for controlling a memory system according to an embodiment.

FIG. 7 illustrates an example embodiment of a second operation of the controller 130 regarding a plurality of read requests. For example, the second operation may be performed by the correlation circuitry 194 in the controller 130.

Referring to FIG. 7, the second, third, eighth, and ninth read requests RD2, RD3, RD8, RD9 may be included in the map hit group MH. Referring to map data and map information for logical addresses LA005, LA250, LA001, LA002 input with the second, third, eighth, and ninth read requests RD2, RD3, RD8, RD9, the controller 130 may recognize physical locations (e.g., where data associated with the logical addresses LA005, LA250, LA001, LA002 is stored) in the memory device 150 (e.g., see FIGS. 1 to 4).

The correlation circuitry 194 in the controller 130 does not need to check a specific position (e.g., a page address where data is stored) in order to correlate a read request. In order to correlate a read request, it may be sufficient that the correlation circuitry 194 checks only whether the corresponding data is stored in any of memory units supporting interleaving operations, e.g., any of a plurality of memory dies 240A to 240D in the memory device 150.

According to an embodiment, the plurality of memory dies 240A to 240D may be included in the memory device 150, and each memory die may include a plurality of memory blocks. Each memory block may include a plurality of pages. A physical address, indicating the physical location where the data is stored, may include a plurality of bits that indicate a memory die, a memory block, a page, etc. The correlation circuitry 194 in the controller 130 can check some (e.g., predetermined number), but not all, bits of the physical address to recognize in which memory unit (e.g., die or plane) the corresponding data is stored.

With reference to the map data or map information, the controller 130 may recognize in which memory units (e.g., dies) data associated with the logical addresses LA005, LA250, LA001, LA002 input with the second, third, eighth, and ninth read requests RD2, RD3, RD8, RD9 is stored. For example, data associated with the logical address LA005 is stored in the third memory die DIE #3, and data associated with the logical address LA250 is stored in the third memory die DIE #3. Data associated with the logical address LA001 is stored in the first memory die DIE #1, and data associated with the logical address LA002 is stored in the fourth memory die DIE #4. Referring to FIG. 4, the first memory die DIE #1 is connected to the controller 130 through the first channel CH #1, and the third memory die DIE #3 and the fourth memory die DIE #4 is connected to the controller 130 through the second channel CH #2.

Because data associated with the logical address (input together with the second read request RD2 and the third read request RD3) may be transferred from the memory device 150 through the second channel CH #2, the second read request RD2 and the third read request RD3 may not be correlated with each other for an interleaving operation.

Thereafter, the controller 130 recognizes that data associated with the logical address (input together with the eighth read request RD8) is stored in the first memory die DIE #1, and the data may be delivered through the first channel CH #1 from the device 150. The eighth read request RD8 may be correlated with the second read request RD2 for the interleaving operation.

The controller 130 may recognizes that data corresponding to the logical address (input together with the ninth read request RD9) is stored in the fourth memory die DIE #4, and the data may be delivered from the memory device 150 via the second channel CH #2. Because data corresponding to the ninth read request RD9 and the third read request RD3 both are received through the second channel CH #2, the ninth read request RD9 and the third read request RD3 may be not correlated for the interleaving operation. The correlation circuitry 194 in the controller 130 may perform the first correlation operation on the map hit group MH. In the map hit group MH, some read requests may be correlated, but other read requests might be not correlated.

Figure 8:
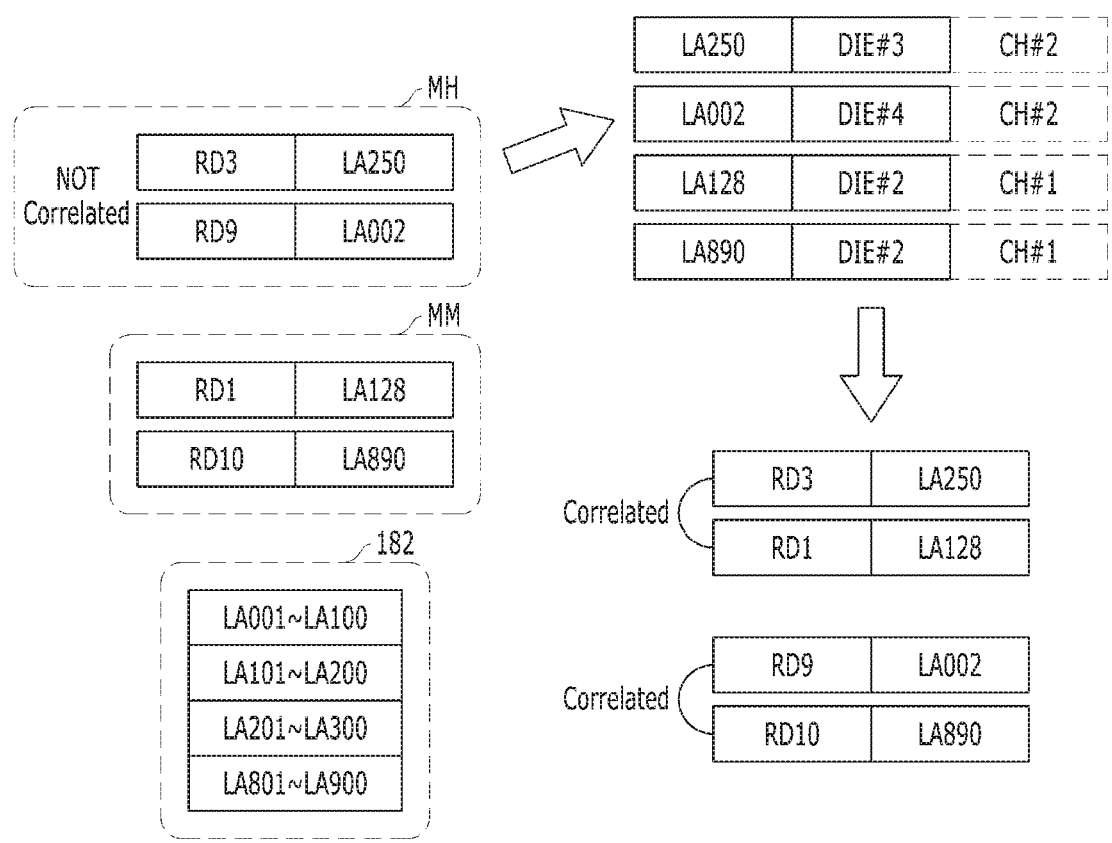
FIG. 8 illustrates a method for controlling a memory system according to an embodiment.

FIG. 8 illustrates an example embodiment of a method for controlling an operation in a memory system. This method describes a second correlation operation performed by the correlation circuitry 194 in the controller 130.

Referring to FIG. 8, the second correlation operation is performed on a third read request RD3 and a ninth read request RD9, that are not correlated in the map hit group MH, as well as a first read request RD1 and a tenth read request RD10 included in the map miss group MM. For the second correlation operation on some read requests included in the map miss group MM, the controller 130 may request map data or map information, associated with the some read requests, at the memory device 150 and store requested map data or map information in the map memory 182.

Referring to the map data or map information stored in the map memory 182, the controller 130 may recognize locations of data associated with corresponding logical addresses input along with the first read request RD1 and the tenth read request RD10 included in the map miss group MM. For example, the data corresponding to the logical addresses (input together with the first read request RD1 and the tenth read request RD10) is stored in the second memory die DIE #2. Both the third read request RD3 and the ninth read request RD9 can generate data transmission through the second channel CH #2 between the memory device 150 and the controller 130. Because the first read request RD1 and the tenth read request RD1.0 can generate data transmission through the first channel CH #1, the third read request RD3 and the ninth read request RD9 may be individually correlated with the first read request RD1 and the tenth read request RD10. Referring to FIG. 8, the third read request RD3 and the first read request RD1 are correlated with each other, and the ninth read request RD9 and the tenth read request RD1.0 are correlated with each other.

Figure 9:
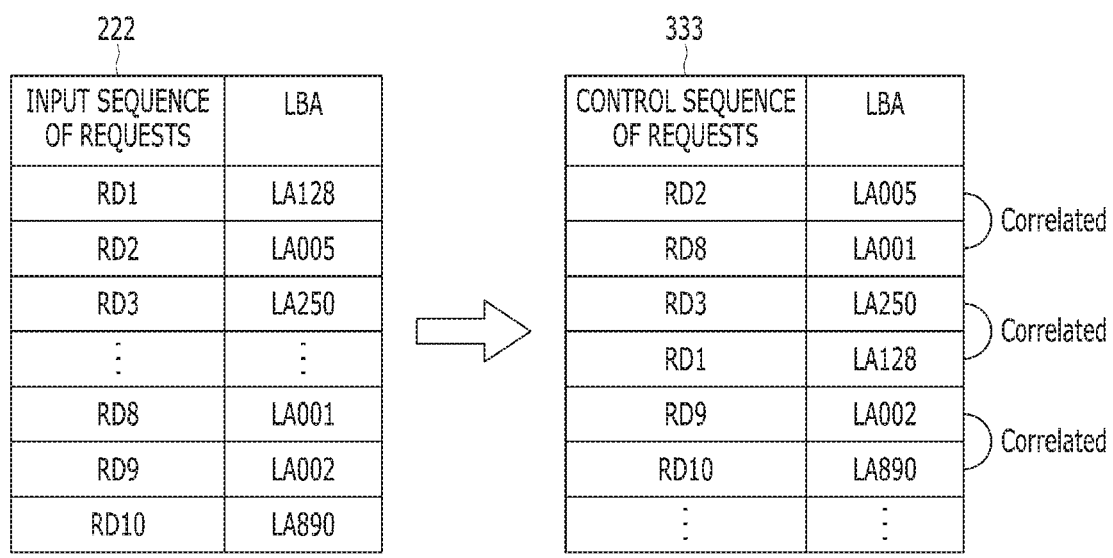
FIG. 9 illustrates a result of correlation process according to an embodiment.

FIG. 9 illustrates example results of the correlation operation performed by the controller 130. Referring to FIG. 9, the plurality of read requests 222 from the host 102 may include the ten read requests RD1 to RD10. The plurality of read requests 222 may be arranged according to the order in which they are delivered to the memory system 110 or the controller 130.

After the processes shown in FIGS. 6 to 8, the plurality of correlated read requests 333, which are correlated by the controller 130, are arranged in an order of execution (e.g., a correlation sequence, not an input sequence). The second read request RD2 and the eighth read request RD8 are correlated through the first correlation operation. But, through the second correlation operation, the third read request RD3 and the first read request RD1 are correlated with each other, and the ninth read request RD9 and the tenth read request RD1.0 are correlated. According to a correlation sequence, the plurality of read requests RD1 to RD10 are transferred to the operation control circuitry 196. According to a transferred order, the operation control circuitry 196 may determine an execution order. If another read request is not correlated with another read request, the uncorrelated read request may be transferred later then the correlated read request, so that the uncorrelated read request may be performed after the correlated read request is performed. The execution order may indicate an order in which the operation control circuitry 196 in FIG. 5 handles or processes a plurality of read requests. According to an embodiment, after performing the first correlation operation and before performing the second correlation operation, correlated read requests during the first correlation operation may be delivered to the memory device 150 in the correlation sequence to improve input/output performance of the memory system 110.

As described above, a plurality of read requests received in the memory system 110 may be correlated corresponding to the number of channels in the memory system 110, and then each read request may be individually executed. Even if the memory system 110 does not have the address limitation structure with a strict rule controlling the physical location for storing an item of data for an interleaving operation, the controller 130 in the memory system 110 may perform the correlation operation on the plurality of read requests and then perform operations corresponding to the plurality of read requests according to a rescheduled order or an adjusted order based on a result of the correlation operation. Accordingly, plural items of data between the memory device 150 and the controller 130 may be transmitted in an interleaving manner or according to an interleaving scheme through the plurality of channels.

Although the correlation operation is performed on some of the plurality of read requests, the data input/output performance of the memory system 110 may be improved compared to when interleaving data transmission does not occur for all the plurality of read requests. In addition, so that the correlation operation does not degrade the data input/output performance of the memory system 110, the correlation operation may be performed for read requests when there are plural items of data to be output to the host 102 in the output buffer 186. For example, when 30 read requests are received in a situation where there is no item of data in the output buffer 186, the memory device 110 may skip correlating three read requests among the 30 read requests and control the operation control circuitry 196 to execute operations corresponding to the three read request in accordance with an input order without the correlation operation. While the operation control circuitry 196 executes three read requests to output read data to the host 102, the correlation circuitry 194 in the controller 130 may attempt to correlate 27 other read requests.

In this example, it may be assumed that three read requests are not correlated with each other in the process of attempting the correlation operation for the other 27 read requests. The correlation circuitry 194 may stop attempting the correlation operation with respect to the three remaining read requests, because the probability of correlation may be low when that few (e.g., under a predetermined number of) read requests remain. When the correlation circuitry 194 unnecessarily uses resources to attempt to correlate a few read requests, the correlation circuitry 194 may affect the data input/output performance of the memory system 110.

As described above, according to an embodiment, the controller 130 may control whether to attempt to correlate a plurality of read requests. For example, the controller 130 may determine whether to perform the correlation operation on the first of the plurality of read requests according to a state of the output buffer 186. In another example, before the number of read requests (stored in the buffer after being externally input) reaches a threshold value, the controller 130 may determine whether to request map data through a process of searching for map data or map information for address translation in relation to at least some of the read requests. The threshold value may be determined, for example, based on operation margins related to data input/output operations performed in the memory system 110, the controller 130, or the memory device 150.

In addition, when another read request for the correlation operation is continuously received, the correlation operation may be continued for a previously input read request and a currently input read request. However, when there are no more read requests received, uncorrelated read requests might be passed to perform a corresponding operation according to the order in which such read requests were received, in order to avoid deteriorating the data input/output performance of the memory system 110. When the controller 130 holds uncorrelated read requests for correlation operation with other read requests, the data input/output performance of the memory system 110 might be degraded.

In at least some cases, it may be difficult for the memory system 110 to predict the likelihood that a plurality of read requests will be correlated with each other because such likelihood changes. For example, the probability of the controller 130 performing a correlation operation may increase as the number of read requests for the correlation operation increases. Conversely, a lower number of received read requests may indicate a lower probability of performing the correlation operation. Because plural items of data requested by the host 102 may be distributed even when the memory system 110 does not apply an address limitation to store the plural items of data, the probability that the controller 130 may correlate read requests may vary as indicated above.

In an embodiment, the controller 130 may perform the correlation operation on a plurality of read requests for a random read operation and/or a sequential read operation which the host 102 requests from the memory system 110.

Figure 10:
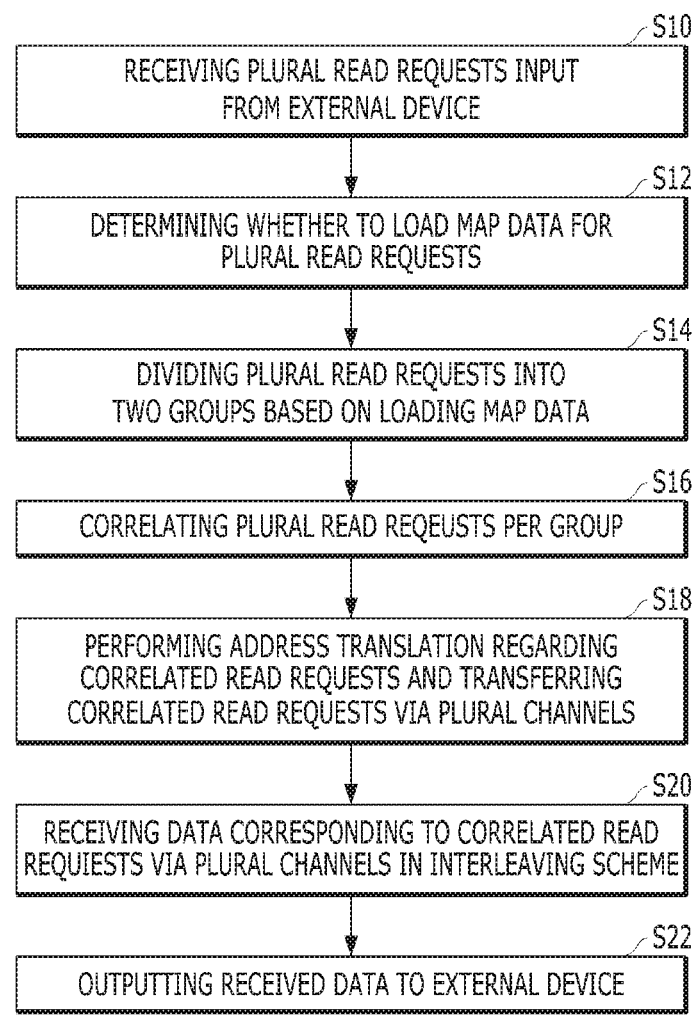
FIG. 10 illustrates a method for operating a memory system according to an embodiment.

FIG. 10 illustrates an embodiment of a method for operating a memory system. Referring to FIG. 10, the method for operating a memory system may include receiving plural read requests input from an external device (S10) and determining whether to load map data for the plurality read requests (S12). Each of the plural read requests is input with a logical address. When map data associated with the logical address is loaded in the memory 144, the controller 130 does not have to generate a request for loading the map data. However, when the map data associated with the logical address is not loaded in the memory 144, the controller 130 determines that the map data should be loaded for address translation and a correlation operation.

The method may further include dividing the plural read requests into two group based on whether to load the map data (S14) and correlating the plural read requests per group (S16). The method may further include performing the address translation regarding correlated read requests and transferring correlated read requests via plural channels or plural data paths (S18). According to a correlation sequence, the correlated read requests is transferred into plural memory dies. The plural memory dies may output data based on a transmission sequence. In addition, the method may include receiving plural items of data corresponding to the correlated read requests in an interleaving scheme or manner (S18) and outputting the plural items of data to the external device, e.g., the host (S20).

In FIG. 10, data input/output operations are performed based on plural memory dies and plural channels in a memory system. However, as described in FIGS. 1 and 10, the plural read requests may be correlated based on a memory unit (e.g., a die, a plane, etc.) capable of supporting an interleaving operation in memory device 110.

In some embodiments, the method for operating the memory system may further include performing an address translation regarding an uncorrelated read request sequentially in order to transfer the uncorrelated read request to a specific memory die among the plurality of memory dies, and receiving an item of data corresponding to the uncorrelated read request from the specific memory die. Additionally, by way of example but not limitation, the memory system may determine an execution order or sequence of the plurality of read requests according to whether they are correlated, not on the order in which the plurality of read requests were received. The memory system may perform operations corresponding to the correlated read requests first and, then, perform an operation corresponding to uncorrelated read request(s).

In some embodiments, the method for operating the memory system may further include determining whether the number of items of data to be output to the external device in the output buffer is more than a reference value. The reference value may be determined, for example, based on a first data input/output speed between the external device and/or the memory system and/or a second data input/output speed between the controller and the plurality of memory dies. For example, if it takes 10 ms for the memory system to transmit an item of data to the external device, then the memory system may have an operating margin of 100 ms (=10×10) when the output buffer includes 10 items of data to be output to the external device. In this example, consider the case where it takes 5 ms to transfer a read request and receive an item of data between the controller and the plurality of memory dies in the memory system. Then, the controller may attempt to correlate a plurality of read requests during an operating margin secured up to 95 ms of the 100 ms.

In one embodiment, the controller may recognize an operation speed (or a set operation margin) for an internal operation, check a time spent on the internal operation, and calculate an operation margin according to a protocol defining communication between the host and the memory system. Accordingly, the controller may calculate and estimate an operation margin for attempting to correlate the plurality of read requests. For example, the controller may calculate the maximum value of the operating margin secured for the correlation operation and perform the correlation operation to the plurality of read requests during a time corresponding to 70 to 90% of the maximum value. According to an embodiment, the time range during which the controller may attempt to correlate the plurality of read requests may be different or vary. Further, the controller may dynamically determine an operation margin when the controller may attempt to correlate the plurality of read requests based on an operation environment of the memory system and an operating state of the memory device.

In one embodiment, the controller 130 in the memory system 110 may determine whether to request map data through a process of searching for the map data for address translation in relation to at least some read requests, before the number of read requests which are stored in the buffer after being input from the outside reaches a threshold (S12). As described above, to perform operation S12 of determining whether to load or request the map data for handling the plurality of read requests, the threshold for the number of the plurality of read requests may be determined based on an operation margin related to data input/output operations performed through the memory system 110, the controller 130 or the memory device 150.

When map data associated with logical addresses (input together with one or more read requests) is not loaded in a cache memory (or a map data region in a volatile memory), operation S12 for determining whether to load or request the map data may include requesting corresponding map data from the plurality of memory dies. If there is not enough space to store the map data in the cache memory, requested map data may be loaded after updated map data is programmed into the memory device and released. Alternatively, unnecessary map data may be released in the cache memory. For example, when the map data requested in the region cannot be stored in the cache memory, the map data used least recently in the cache memory may be released. According to an embodiment, when the requested map data cannot be stored in the cache memory, the map data least frequently used in the cache memory may be released.

According to an embodiment, determining whether to load or request the map data (S12) may be performed, for handling a plurality of read requests, before the number of the plurality of read requests stored in the buffer reaches a threshold. If the controller stands by or waits, for purposes of performing a correlation operation, until the number of read requests stored in the buffer reaches the threshold, operation efficiency of the memory system may be degraded.

In order to increase or improve the operation efficiency of the memory system, the controller may search for map data or map information associated with at least some of the plurality of read requests stored in the buffer before the number of the plurality of read requests reaches the threshold. Through this way, the controller may fast determine whether to request or load map data from the memory system to perform address translation and a correlation operation in response to the plurality of read requests, so that overheads caused by the correlation operation may be reduced.

Operation S14 for dividing the plurality of read requests into two groups, based on whether to load the map data associated with the logical address (input together with each of the plurality of read requests stored in the memory), may include classifying the plurality of read requests into two groups including a map hit group and a map miss group. By sequentially performing a correlation operation per group after dividing the plurality of read requests into the map hit group and the map miss group, it is possible to avoid unnecessary map data replacement (e.g., loading and releasing of the map data) for the correlation operation.

After dividing the plurality of read requests into the two groups, correlation may be attempted sequentially. For example, operation S16 for performing the correlation operation may include performing a first correlation operation on first read requests in the map hit group, requesting map data corresponding to one or more second read requests in the map miss group at the memory device to store requested map data in the memory, and performing a second correlation operation on both the one or more second read requests and one or more of the first read requests which is not correlated through the first correlation operation.

The first pairing is performed on the first read request in the map hit group, and the map data corresponding to the second read request in the map miss group is displayed. Requesting, storing requested map data transmitted from a plurality of memory dies in a memory, and performing a second pairing on the first read request and the second read request that are not paired in the first pairing may include one or more operation as described herein.

In accordance with one or more of the aforementioned embodiments, a correlation operation correlates some read requests to be transmitted in parallel to different memory dies via different channels, so that plural items of data output from the different memory dies are transmitted in parallel via the different channels. This may be referred to, for example, as a channel interleaving scheme. According to one embodiment, the correlation operation may be applied to correlate some read requests to be alternatively transmitted to different memory dies via the same channel, so that plural items of data output from the different memory dies are transmitted alternatively via the same channel. This may be referred to as a way interleaving scheme.

According to an embodiment, a memory system, a data processing system, a method of operating the same, and a method of supporting an operation may avoid an address limitation regarding a physical location in the memory system, which is allocated for storing data, for interleaving operation. Thus, the memory system may reduce overhead in the memory system for an interleaving operation. In addition, one or more embodiments may improve data input/output performance through an interleaving operation in a memory system, and may reduce the address limitation regarding an physical location in the memory system for the interleaving operation, so that operational efficiency and lifespan of the memory device may be improved.

While the present invention has been illustrated and described with respect to the specific embodiments, it will be apparent to those skilled in the art in light of the present disclosure that various changes and modifications may be made without departing from the spirit and scope of the invention as defined in the following claims. The invention encompasses all changes and modifications that fall within the scope of the claims.

What is claimed is:

1. A memory system, comprising:
a memory device including a plurality of memory units inputting or outputting data individually; and
a controller coupled with the plurality of memory units via a plurality of data paths, the controller configured to perform a correlation operation on two or more read requests among a plurality of read requests input from an external device, the correlation operation performed so that the plurality of memory units output plural items of data corresponding to the plurality of read requests via the plurality of data paths based on an interleaving manner, wherein the controller is further configured to determine whether to load map data associated with the plurality of read requests before a count of the plurality of read requests reaches a threshold, divide the plurality of read requests into two groups based on whether to load the map data, and perform the correlation operation per group.

2. The memory system according to claim 1, wherein the controller is configured to perform the correlation operation when a number of items of data stored in an output buffer, before being output to the external device, is greater than a threshold.

3. The memory system according to claim 2, wherein:
the output buffer includes a queue outputting stored data according to an input sequence of the stored data, and
the controller is configured to determine the threshold based on a first data input/output speed between the external device and the memory system and a second data input/output speed between the controller and the plurality of memory units.

4. The memory system according to claim 1, wherein the controller is configured to:
establish a region allocated to store the map data in a cache memory or a volatile memory;
store the map data delivered from the plurality of memory units in the region; and
when map data associated with one or more logical addresses input with the plurality of read requests is not loaded in the region, request unloaded map data at the plurality of memory units.

5. The memory system according to claim 4, wherein the controller is configured to release an item of map data, which is least recently used, in the region when requested map data is not storable in the region.

6. The memory system according to claim 4, wherein the controller is configured to release an item of map data, which is least frequently used, in the region when requested map data is not storable in the region.

7. The memory system according to claim 1, further comprising:
a memory configured to store the map data used for address translation;
an input buffer configured to store the plurality of read requests; and
an output buffer configured to store the plural items of data output to the external device.

8. The memory system according to claim 7, wherein the controller comprises:
buffer control circuitry configured to monitor states of both the input buffer and the output buffer to determine whether to perform the correlation operation;
grouping circuitry configured to divide the plurality of read requests into the two groups, including a map miss group and a map hit group, based on whether the map data corresponding to logical addresses input with the plurality of read requests is loaded in the memory;
correlation circuitry configured to perform a first correlation operation on first read requests in the map hit group, request map data corresponding to one or more second read requests in the map miss group at the memory device to store requested map data in the memory, and perform a second correlation operation on the one or more second read requests and one or more of the first read requests not correlated through the first correlation operation; and
operation control circuitry configured to transmit read requests, correlated through the first and second correlation operations to the plurality of memory units via the plurality of data paths, based on a correlation sequence of the read requests.

9. The memory system according to claim 8, wherein the operation control circuitry is configured to:
  perform address translation for uncorrelated read requests sequentially, and
  transmit the uncorrelated read requests to the plurality of memory units after performing address translation for correlated read requests.

10. The memory system according to claim 8, wherein the correlation circuitry is configured to:
  monitor an operation state of the operation control circuitry, and
  transmit at least one of the first read requests to the operation control circuitry, without performing the first correlation operation, when the operation control circuitry is in an idle state.

11. The memory system according to claim 1, wherein a count of read requests correlated with each other is same as a count of the plurality of data paths.

12. A method for operating a memory system, comprising:
  receiving a plurality of read requests from an external device;
  determining whether to load map data associated with the plurality of read requests when a count of the plurality of read requests reaches a threshold;
  dividing the plurality of read requests into two groups based on whether to load the map data;
  performing a correlation operation per group;
  transmitting correlated read requests to a plurality of memory units via a plurality of channels according to a correlation sequence;
  receiving data corresponding to the correlated read request from the plurality of memory units via the plurality of channels based on an interleaving manner; and
  outputting the data to the external device.

13. The method according to claim 12, further comprising:
  performing the address translation for an uncorrelated read request to transfer the uncorrelated read request to a plurality of memory units via a plurality of channels; and
  receiving other data corresponding to the uncorrelated read request from the plurality of memory units to output the other data to the external device.

14. The method according to claim 12, further comprising:
  determining whether the number of items of data, stored in an output buffer before being output to the external device, is greater than a threshold.

15. The method according to claim 14, wherein the threshold is determined based on:
  a first data input/output speed between the external device and the memory system, and
  a second data input/output speed between a controller and the plurality of memory units.

16. The method according to claim 12, wherein the determining of whether to load the map data comprises:
  when map data associated with one or more logical addresses input with the plurality of read requests is not loaded in a region of a cache memory or a volatile memory, requesting unloaded map data at the plurality of memory units.

17. The method according to claim 16, further comprising: releasing an item of map data, which is least recently used, in the region when requested map data is not storable in the region.

18. The method according to claim 16, further comprising: releasing an item of map data, which is least frequently used, in the region when requested map data is not storable in the region.

19. The method according to claim 12, wherein the dividing of the plurality of read requests comprises:
  dividing the plurality of read requests into the two groups, including a map miss group and a map hit group, based on whether the map data corresponding to logical addresses input with the plurality of read requests is loaded in a memory.

20. The method according to claim 19, wherein the performing of the correlation operation comprises:
  performing a first correlation operation on first read requests in the map hit group;
  requesting map data corresponding to one or more second read requests in the map miss group at the memory device to store requested map data in the memory; and
  performing a second correlation operation on both the one or more second read requests and some of the first read requests which is not correlated through the first correlation operation.

* * * * *